METHOD OF MAKING ELECTRICAL CONTACTS FOR AND PASSIVATING A SEMICONDUCTOR DEVICE

Filed Jan. 24, 1972

United States Patent Office 3,806,361
Patented Apr. 23, 1974

3,806,361

METHOD OF MAKING ELECTRICAL CONTACTS FOR AND PASSIVATING A SEMICONDUCTOR DEVICE

Leo L. Lehner, Scottsdale, Ariz., assignor to Motorola, Inc., Franklin Park, Ill.

Filed Jan. 24, 1972, Ser. No. 204,641
Int. Cl. B44d *1/18, 1/10*
U.S. Cl. 117—212 7 Claims

ABSTRACT OF THE DISCLOSURE

The method of making electrical contacts for and passivating a semiconductor device includes the steps of depositing thereover a layer of polycrystalline silicon material and selectively doping the polycrystalline silicon material at locations whereat the electrical connections are to be made to render it conductive thereat. In the case of semiconductor devices having a passivating layer of $SiO_2$ or the like thereover, the $SiO_2$ must first be removed in those areas whereat the electrical contacts are to be formed.

BACKGROUND OF THE INVENTION

This invention relates generally to methods for making electrical contacts for semiconductor devices and more particularly to such methods for making electrical connections to semiconductor devices which have been passivated.

Presently, when making electrical contacts for a semiconductor device having an $SiO_2$ or the like passivation layer deposited thereover, a section of the $SiO_2$ layer is first removed. Thereafter, the area from which the $SiO_2$ material was removed is filled with a conductive material such as, for example, aluminum, to which an electrical connection can be made.

While the above described technique provides an adequate electrical contact for the semiconductor device, the area whereat the aluminum is deposited, is not passivated and is susceptible to contamination by foreign particles. Contamination of the area can cause malfunction of the semiconductor device at a later time.

SUMMARY OF THE INVENTION

Accordingly, it is a general object of the present invention to provide a new and improved method for making electrical contacts for semiconductor devices, which overcomes the drawbacks of the prior art.

It is another object of the present invention to provide a new and improved method for forming electrical contacts for semiconductor devices wherein the sites of the electrical contacts are passivated.

Briefly, the method according to the invention comprises the steps of removing from a passivated semiconductor device, an area of passivating material to expose the semiconductor material therebeneath whereat an electrical contact is to be formed. Thereafter, a layer of polycrystalline silicone is deposited over the semiconductor device including the exposed area. Subsequent to the deposition of the last-mentioned material, aluminum or the like metal is sintered in to dope the polycrystalline silicon covering the exposed area, thereby providing a conductive area through the polycrystalline silicon whereat an electrical connection may be made to the semiconductor material therebeneath. The polycrystalline silicone serves both as a conductor for making the electrical contact and as a passivating material for the device.

It is not necessary that a passivation layer of material be applied prior to the application of the polycrystalline silicon, however, it is advantageous since the gain of the semiconductor device may be affected without the highly resistive passivating layer such as, $SiO_2$, being provided beneath the polycrystalline silicone.

DETAILED DESCRIPTION

Figures 1, 2, 3, 4, 5, 6, 7:
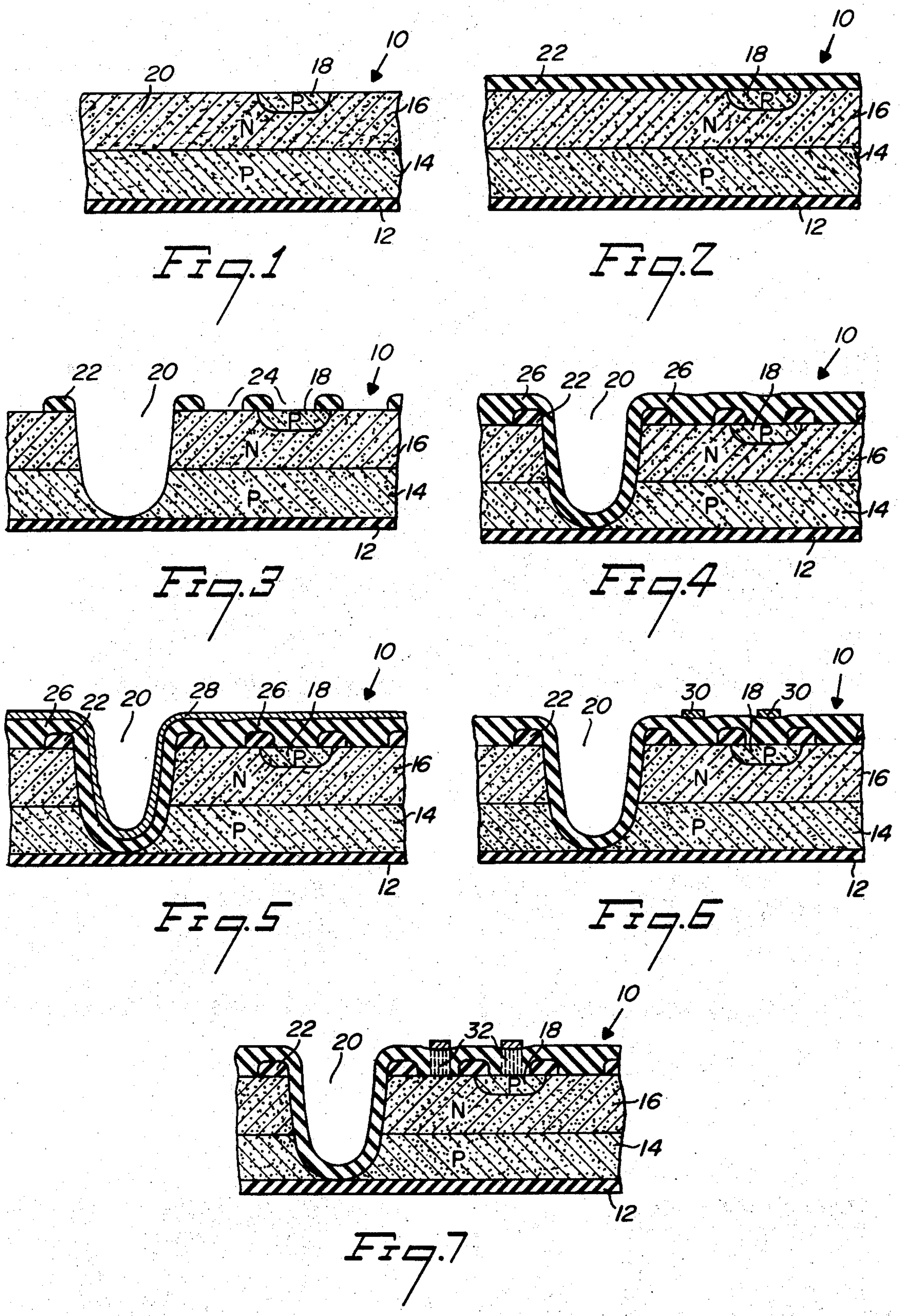
FIGS. 1–7 are cross-sectional, fragmentary views of a semiconductor device as it appears during the various stages of the method according to the invention for preparing electrical contacts therefor and for passivating the contact areas.

Referring now to the drawing in greater detail, FIGS. 1–7 illustrate a semiconductor device, designated generally by the numeral 10, herein shown as a transistor component having a lower substrate or wafer 12 of silicon or the like material. Deposited over the wafer 12, are layers 14, 16 of P and N type semiconductor material, respectively. A P type area 18 is diffused into the upper N type layer. In the case of the device shown, area 18 forms the emitter portion of the transistor while areas 16 and 14 form the base and collectors thereof, respectively. The use of a transistor component in the drawing of the instant application is for illustrative purposes only since the method according to the invention may be applied to semiconductor devices other than transistors.

During the formation of the devices, a passivation layer 22 of $SiO_2$ or the like material may be deposited over the surface of the device. The highly resistive passivation material maintains the device contaminant free. In the production of semiconductor devices of the type shown, i.e., mesa type semiconductor devices, the semiconductor material of the various layers is etched away to form valleys, such as 20, which separate the remaining semiconductor devices. The etching also removes the passivation material from the junction in the valley.

To provide electrical contacts for the various layers of the semiconductor device, areas of the $SiO_2$ beneath which such contacts are to be provided, are removed to expose the semiconductor layers (see FIG. 3). Conventionally, metal is deposited in the openings, such as 24, formed in the $SiO_2$ to make physical contact with the semiconductor material. In the latter technique, however, the valleys and contact areas remain unpassivated and therefore are susceptible to contamination which could affect the operation of the semiconductor device.

In the method according to the invention, subsequent to the removal of the $SiO_2$ passivating material to form openings 24 (FIG. 3), a layer 26 of polycrystalline semiconductor material, preferably polycrystalline silicon, is deposited over the $SiO_2$ layer (FIG. 4). The last-mentioned layer can be deposited over the semiconductor device by passing the device through a heated chamber having an atmosphere of $SiCl_4$ and $H_2$. The polycrystalline silicon layer formed over the semiconductor device further passivates the device including the areas 24 and 20 exposed by the removal of the semiconductor material and $SiO_2$ prior thereto.

Subsequent to the deposition of the polycrystalline silicon, a layer 28 of aluminum or the like conductive metal is provided thereover (FIG. 5). The metallized layer can be "sputtered" or vacuum deposited onto the semiconductor device in a well known manner, or any other suitable technique may be used if desired. Thereafter, the conductive layer provided over the areas adjacent those areas to be used as electrical contact areas, is etched away, leaving only the metallized areas, such as 30 on the polycrystalline silicon, which are in alignment with the openings 24 in the $SiO_2$ therebeneath. The removal of the unwanted metallized areas may be accomplished by overlaying the aluminum after deposition thereover, with a layer of impervious material such as wax, or the like. Thereafter, the wax is removed at those areas which are not to be used electrical contact areas. Subsequent thereto an etching solution is applied to remove the unprotected metallized areas leaving those areas which are to serve as electrical contact areas. Subsequent to the etching away of the unwanted metallized areas, the impervious layer may be removed from those metallized areas remaining.

After the above has been accomplished, the semiconductor device is heated at a temperature in the range of 400–500° C. to "sinter" the aluminum into the polycrystalline silicon material therebeneath. The latter dopes the polycrystalline silicon areas, such as 32, beneath the sites of conductive metal, rendering those areas conductive, thereby making an electrical connection possible to the semiconductor material therebeneath.

The doped polycrystalline silicon serves both as a conductive contact area whereat electrical connections to the semiconductor device may be made as well as passivating material to maintain the area contaminant free.

While the above description was given in conjunction with a semiconductor device having a passivation layer of $SiO_2$ thereover, it is not necessary to provide such a layer in addition to the polycrystalline silicon layer. Instead, the polycrystalline silicon layer may be deposited over the semiconductor device 10 as shown in FIG. 1. Thereafter, the steps illustrated in FIGS. 5–7 may be taken to provide electrical contacts for the device.

I claim:

1. The method of making electrical contacts for semiconductor devices comprising the steps of:

depositing a layer of polycrcystalline silicon material over said semiconductor device;

depositinng an aluminum layer at locations whereat electrical contacts are to be formed; and heating said semiconductor device to cause said aluminum to be sintered into said polycrystalline material thereat thereby rendering said area conductive and making electrical connections with said semiconductor material.

2. The method of claim 1 wherein said semiconductor device includes a passivation layer provided thereover and further including the step of removing said passivation material at said desired locations prior to the deposition of said polycrystalline material over said semiconductor device.

3. The method of making electrical contacts for a semiconductor device having a highly resistive passivating material deposited thereover, comprising the steps of: removing said passivating material at predetermined locations whereat said electrical contacts are to be formed, depositing a layer of polycrystalline silicon material over said passivation layer and the areas whereat said passivating material has been removed, and doping said polycrystalline material at locations aligned with said predetermined locations to render the polycrystalline material thereat electrically conductive, thereby to make electrical contact with said semiconductor material therebeneath.

4. The method of claim 3 wherein the doping of said polycrystalline material comprises the steps of: depositing metallic material over said polycrystalline layer at locations aligned with said predetermined locations and heating said device to cause said metallic material to diffuse into said polycrystalline material, thereby rendering said last-mentioned material conductive at said locations.

5. The method of claim 4 wherein the deposition of metallic material over said polycrystalline silicon layer comprises the steps of: depositing said metallic material over said polycrystalline layer, applying an impervious layer of material over predetermined areas of said metallic material, etching away the metallic material not covered by said impervious layer, removing said impervious layer over the remaining metallic material subsequent to etching, and heating said semiconductor device for sintering said metal into said polycrystalline material at said predetermined locations.

6. The method of claim 5 wherein said semiconductor device is heated at a temperature in the range of 400–500° C. for sintering the conductive metal into said polycrystalline material.

7. The method of making electrical contact for and passivating a semiconductor device which includes thereover a layer of highly resistive passivating material comprising the steps of:

removing said highly resistive passivating material at predetermined locations;

depositing a layer of polycrystalline silicon material over the surface of said semiconductor device and said remaining passivating material;

forming a layer of aluminum over said predetermined locations; and heating said semiconductor device to sinter the aluminum into said polycrystalline material to render the polycrystalline material conductive thereat, thereby to complete an electrical connection with said semiconductor device.

References Cited

UNITED STATES PATENTS

| | | | |
|---|---|---|---|
| 3,189,973 | 6/1965 | Edwards | 117—201 |
| 3,481,776 | 12/1969 | Manchester | 117—212 |
| 3,653,120 | 4/1972 | Sireine | 317—234 L |
| 3,667,008 | 5/1972 | Kartack | 317—235 AT |
| 3,703,420 | 11/1972 | Vora | 117—212 |

LEON D. ROSDOL, Primary Examiner

M. F. ESPOSITO, Assistant Examiner

U.S. Cl. X.R.

117—217; 317—234 L, 235 A 6; 148—174, 175; 29—576; 156—17